US009257667B2

(12) United States Patent
Cho et al.

(10) Patent No.: US 9,257,667 B2
(45) Date of Patent: Feb. 9, 2016

(54) ORGANIC LIGHT-EMITTING DISPLAY APPARATUS, METHOD OF MANUFACTURING THE SAME, AND MASK THAT IS USED FOR THE MANUFACTURING

(71) Applicant: SAMSUNG DISPLAY CO., LTD., Yongin, Gyeonggi-Do (KR)

(72) Inventors: Kwan-Hyun Cho, Yongin (KR); Jin-Koo Chung, Yongin (KR); Jun-Ho Choi, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/227,037

(22) Filed: Mar. 27, 2014

(65) Prior Publication Data
US 2014/0326965 A1 Nov. 6, 2014

(30) Foreign Application Priority Data

May 2, 2013 (KR) .................. 10-2013-0049609

(51) Int. Cl.
*H01L 35/24* (2006.01)
*H01L 51/52* (2006.01)
*H01L 27/32* (2006.01)

(52) U.S. Cl.
CPC ........ *H01L 51/5225* (2013.01); *H01L 27/3279* (2013.01); *H01L 51/5221* (2013.01)

(58) Field of Classification Search
CPC .................. H01L 51/5203; H01L 51/5225
USPC ............................................. 257/40, E51.001
See application file for complete search history.

(56) References Cited

U.S. PATENT DOCUMENTS

| 6,784,009 | B2 | 8/2004 | Lim et al. | |
| 2004/0113544 | A1* | 6/2004 | Murakami et al. | 313/504 |
| 2011/0175097 | A1* | 7/2011 | Song et al. | 257/59 |
| 2012/0018770 | A1* | 1/2012 | Lu et al. | 257/99 |
| 2012/0104422 | A1 | 5/2012 | Lee et al. | |
| 2013/0001603 | A1* | 1/2013 | Lim et al. | 257/88 |

FOREIGN PATENT DOCUMENTS

| JP | 2003-108028 A | 4/2003 |
| KR | 10-2009-0016238 A | 2/2009 |
| KR | 10-2012-0044876 A | 5/2012 |

* cited by examiner

*Primary Examiner* — Anthony Ho
(74) *Attorney, Agent, or Firm* — Lee & Morse, P.C.

(57) ABSTRACT

An organic light-emitting display apparatus includes a substrate including a display area and a peripheral area surrounding the display area, a plurality of pixels being disposed in the display area, a plurality of first electrodes in the display area, a plurality of stripe-shaped second electrodes in the display area, the second electrodes extending in a first direction and being spaced apart from each other in a second direction crossing the first direction, and each of the plurality of the second electrodes having an uneven thickness along a third direction inside the display area, an intermediate layer between corresponding first and second electrodes, the intermediate layer having a light-emitting layer, and a connection wiring in the peripheral area, the connection wiring electrically connecting the plurality of the second electrodes with each other.

20 Claims, 7 Drawing Sheets

ORGANIC LIGHT-EMITTING DISPLAY APPARATUS, METHOD OF MANUFACTURING THE SAME, AND MASK THAT IS USED FOR THE MANUFACTURING

CROSS-REFERENCE TO RELATED APPLICATION

Korean Patent Application No. 10-2013-0049609, filed on May 2, 2013, in the Korean Intellectual Property Office, and entitled: "Organic Light-Emitting Display Apparatus, Method of Manufacturing the Same, and Mask That is Used For the Manufacturing" is incorporated by reference herein in its entirety.

BACKGROUND

1. Field

One or more embodiments relate to an organic light-emitting display apparatus, a method of manufacturing the same, and a mask that is used for the manufacturing of the same. More particularly, one or more embodiments relate to an organic light-emitting display apparatus for preventing deterioration of display image quality that may be caused by a voltage drop, a method of manufacturing the same, and a mask that is used for the manufacturing.

2. Description of the Related Art

An organic light-emitting display apparatus includes an organic-light emitting diode (OLED), in which an intermediate layer that includes a light-emitting layer is interposed between a pixel electrode and an opposite electrode, in a pixel or a sub-pixel. Such an organic light-emitting display apparatus generally controls whether each pixel emits light or a degree of light emission, via a thin-film transistor (TFT) which is electrically connected to the pixel electrode. The opposite electrode is formed as one body with regard to a plurality of pixels or sub-pixels.

SUMMARY

According to an aspect of embodiments, there is provided an organic light-emitting display apparatus including a substrate including a display area and a peripheral area surrounding the display area, a plurality of pixels being disposed in the display area, a plurality of first electrodes in the display area, a plurality of stripe-shaped second electrodes in the display area, the second electrodes extending in a first direction and being spaced apart from each other in a second direction crossing the first direction, and each of the plurality of the second electrodes having an uneven thickness along the first direction inside the display area, an intermediate layer between corresponding first and second electrodes, the intermediate layer having a light-emitting layer, and a connection wiring electrically connecting the plurality of the second electrodes with each other, the connection wiring being disposed in the peripheral area, in an area of the display area which is adjacent to the peripheral area, or across the display area and the peripheral area.

Each of the plurality of the second electrodes may periodically include portions along the first direction in the display area, wherein a thickness of a plurality of the second electrodes is greater in the portions than a thickness of a plurality of the second electrodes in the other portions. Each of the plurality of the second electrodes may alternately include a first part whose length in the first direction is l1 and whose thickness is t1, and a second part whose length in the first direction is l2 and whose thickness is t2 which is greater than t1, along the first direction. In this case, l1 may be longer than l1. t2 may be about twice t1.

A plurality of the second electrodes may extend from the peripheral area into the display area DA.

The connection wiring may extend in the second direction, and periodically include portions along the second direction, wherein a thickness of the connection wiring is greater in the portions than a thickness of the connection wiring in other portions. The connection wiring may alternately include a third part whose length in the second direction is l3 and whose thickness is t3, and a fourth part of which length in the second direction is l4 and whose thickness is t4 which is greater than t3, along the second direction. In this case, t3 may be greater than the t4. t4 may be about twice the t3.

The connection wiring may include a plurality of "+" shape portions that are disposed to partially overlap with each other along the second direction. A plurality of the second electrodes may extend from the peripheral area into the display area DA, and parts of the plurality of the second electrodes may include a "+" shape portion. Specifically, the parts of the plurality of the second electrodes may include a "+" shape portion in a portion from the connection wiring to the display area. Additionally, remaining parts, other than the parts of a plurality of the second electrodes, may extend in the first direction so as to cross the connection wiring and include a "+" shape portion in a direction from the connection wiring CW to a direction opposite to the display area.

The organic light-emitting display apparatus may further include a dummy pattern that includes a same material as that of a plurality of the second electrodes outside the display area.

According to another aspect of the embodiments, there is provided a method of manufacturing an organic light-emitting display apparatus, the method including: preparing a substrate that includes a display area in which a plurality of pixels are to be disposed, and a peripheral area which surrounds the display area; forming a plurality of first electrodes in the display area of the substrate; forming an intermediate layer that includes a light-emitting layer on a plurality of the first electrodes; by using a mask in which a plurality of opening sets, each of which extends in a first direction and includes a plurality of first openings that are separate from each other, are located in a second direction which crosses the first direction, forming a first conductive layer that corresponds to a plurality of the first openings of the mask in the display area of the substrate; and by moving the mask and by using the mask, forming a second conductive layer that corresponds to a plurality of the first openings of the mask in the display area of the substrate and partially overlaps with the first conductive layer.

With regard to the first direction of the mask, a length of each of a plurality of the first openings that extend in the first direction may be greater than a distance between a plurality of the first openings.

The forming of the second conductive layer may include by forming the second conductive layer so that the second conductive layer partially overlaps with the first conductive layer, and thus, the first conductive layer and the second conductive layer from a plurality of stripe-shaped second electrodes which extend in the first direction and are arranged in the second direction.

The mask may further include a plurality of "+" shaped second openings that are separate from each other in the second direction on a periphery of the mask, and wherein the forming of the second conductive layer includes, forming a connection wiring that electrically connects a plurality of the second electrodes with each other, the connection wiring having a plurality of "+" shape portions which are disposed to partially overlap with each other along the second direction.

According to another aspect of the embodiments, there is provided a mask in which a plurality of opening sets, each of which extends in a first direction and includes a plurality of first openings that are separate from each other in the first direction, are located in a second direction which crosses with the first direction, and a plurality of "+" shaped second openings that are separate from each other in the second direction are located on a periphery of the mask.

A plurality of the first openings may be located in a zigzag pattern in the second direction.

A length of each of a plurality of the first openings, which extends in the first direction, may be greater than a distance between a plurality of the first openings in the first direction.

A plurality of the second openings that are separate from each other may be located in a zigzag pattern in the second direction. A plurality of the second openings that are separate from each other may be located in a zigzag pattern in the second direction, so that a virtual line, which extends in the second direction that passes through all of a plurality of the second openings which are separate from each other, exists.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
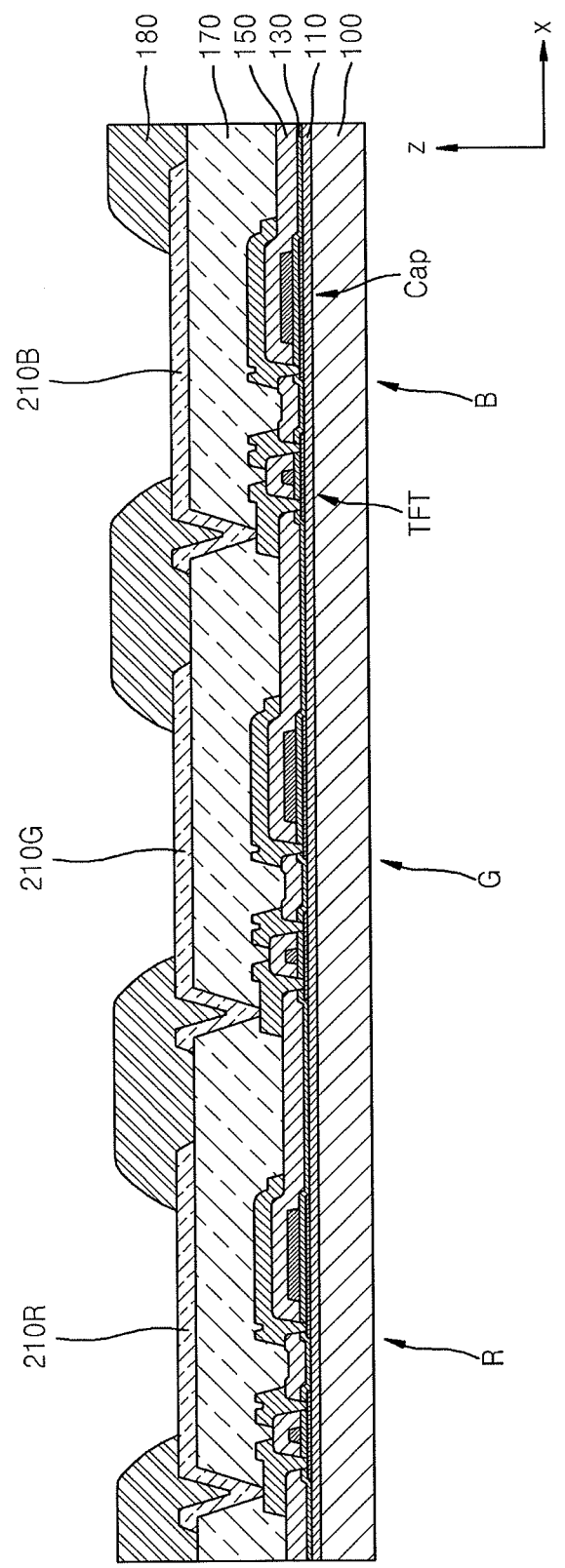
FIGS. 1 through 3 illustrate schematic diagrams of stages in a method of manufacturing an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Further, in the embodiments, X-, Y-, and Z-axes are not limited to three axes on an orthogonal coordinates system, and may be interpreted as having a broad meaning that includes the three axes. For example, X-, Y-, and Z-axes mat be orthogonal to each other. However, X-, Y-, and Z-axes may respectively refer to different directions that are not orthogonal to each other.

FIGS. 1-3 and 6-8 are schematic diagrams illustrating processes according to a method of manufacturing an organic light-emitting display apparatus according to an embodiment.

As illustrated in FIG. 1, a backplane is prepared. It may be understood that the backplane herein at least includes a substrate 100, a plurality of first electrodes 210R, 210G, and 210B that are formed on the substrate 100, and a pixel-defining layer 180 that is formed to expose at least a part of each of a plurality of the first electrodes 210R, 210G, and 210B, to include a center of each of a plurality of the first electrodes 210R, 210G, and 210B. The pixel-defining layer 180 may have a shape which is thicker, i.e., protrudes upward more, than the plurality of the first electrodes 210R, 210G, and 210B in a +Z direction relative to the substrate 100.

The substrate 100 may be formed of various materials such as glass, metal, or plastic, e.g., polyethylene terephthalate (PET), polyethylene naphthalate (PEN), or polyimide. The substrate 100 may include a display area in which a plurality of pixels are disposed, and a peripheral area that surrounds the display area.

It may be understood that a plurality of the first electrodes 210R, 210G, and 210B are pixel electrodes. The pixel electrode 210B may be understood as a first pixel electrode, the pixel electrode 210R may be understood as a second pixel electrode, and the pixel electrode 210G may be understood as a third pixel electrode. This is because intermediate layers, which are formed on the first through third pixel electrodes, may respectively be different from each other. Hereinafter, for convenience of description, terms such as the pixel electrode 210R, the pixel electrode 210G, and the pixel electrode 210B may be used, instead of the first electrode, the first pixel electrode, the second pixel electrode, and the third pixel electrode.

The pixel electrodes 210R, 210G, and 210B may be translucent, transparent, or reflective electrodes. If the pixel electrodes 210R, 210G, and 210B are translucent or transparent electrodes, the pixel electrodes 210R, 210G, and 210B may be formed of, e.g., indium tin oxide (ITO), indium zinc oxide (IZO), zinc oxide (ZnO), indium oxide ($In_2O_3$), indium gallium oxide (IGO), or aluminum zinc oxide (AZO). If the pixel electrodes 210R, 210G, and 210B are reflective electrodes, the pixel electrodes 210R, 210G, and 210B may include a reflective layer which is formed of, e.g., silver (Ag), magnesium (Mg), aluminum (Al), platinum (Pt), palladium (Pd), gold (Au), nickel (Ni), neodymium (Nd), iridium (Ir), chromium (Cr), or a compound thereof, and a layer which is formed of ITO, IZO, ZnO, or $In_2O_3$. However, the composition and material of the pixel electrodes 210R, 210G, and 210B are not limited thereto, and may be variously modified. The pixel electrodes 210R, 210G, and 210B may be located in the display area of the substrate 100.

The pixel-defining layer 180 may define a pixel by having an opening which corresponds to each sub-pixel, i.e., an opening for exposing a center of each of the pixel electrodes 210R, 210G, and 210B, or the entire pixel electrodes 210R, 210G, and 210B. Additionally, the pixel-defining layer 180 may increase a distance between ends, e.g., edges, of the pixel electrodes 210R, 210G, and 210B and an opposite electrode (not illustrated) on the pixel electrodes 210R, 210G, and 210B, thereby preventing generation of an arc at the ends of the pixel electrodes 210R, 210G, and 210B.

The backplane may further include other various elements, as necessary. For example, as illustrated in FIG. 1, a thin-film transistor TFT or a capacitor Cap may be formed on the substrate 100. Additionally, the backplane may further include a buffer layer 110 which is formed to prevent impurities from penetrating into a semiconductor layer of the TFT, a gate insulating layer 130 for insulating the semiconductor layer of the TFT from the gate electrode, an interlayer insulating layer 150 for insulating a source electrode/gate electrode of the TFT from the gate electrode, a planarization layer 170 which covers the TFT and whose upper surface is approximately flat, or other elements.

Figure 2:
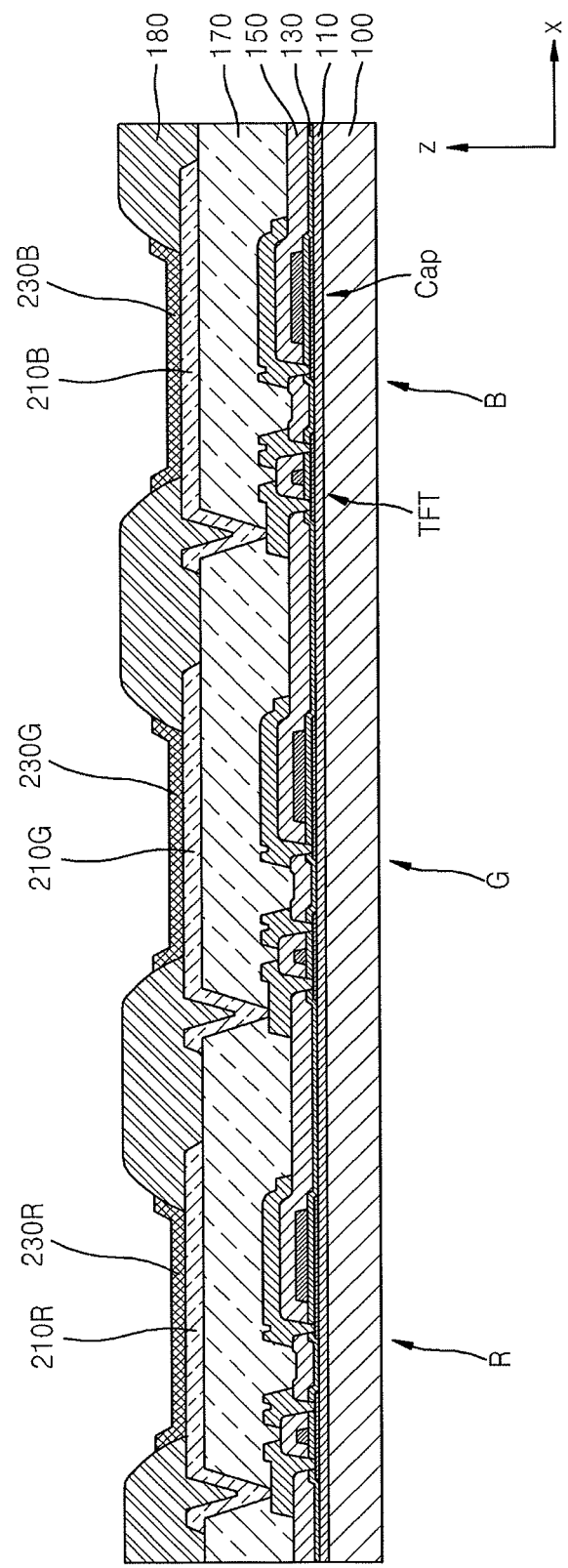

As such, the backplane is prepared, and then, intermediate layers 230R, 230G, and 230B are formed as illustrated in FIG. 2. The intermediate layers 230R, 230G, and 230B may have a multilayered structure that includes a light-emitting layer. In this case, unlike the illustration in FIG. 2, some of the intermediate layers 230R, 230G, and 230B may be common layers that approximately correspond to an entire surface of the substrate 100, and other layers of the intermediate layers 230R, 230G, and 230B may be pattern layers that are patterned to correspond to individual ones of the pixel electrodes 210R, 210G, and 210B. The intermediate layers 230R, 230G, and 230B may be formed of a polymer material or a low-molecular weight material. The intermediate layers 230R, 230G, and 230B may include a hole injection layer (HIL), a hole transport layer (HTL), a light-emitting layer, an electron transport layer (ETL), and/or an electron injection layer (EIL). The intermediate layers 230R, 230G, and 230B may be formed by using various methods, e.g., a deposition method, a spin-coating method, an ink-jet printing method, and/or a laser thermal transferring method. The arrangement of the intermediate layers 230R, 230G, and 230B will be discussed in more detail below with reference to FIG. 3.

Figure 3:
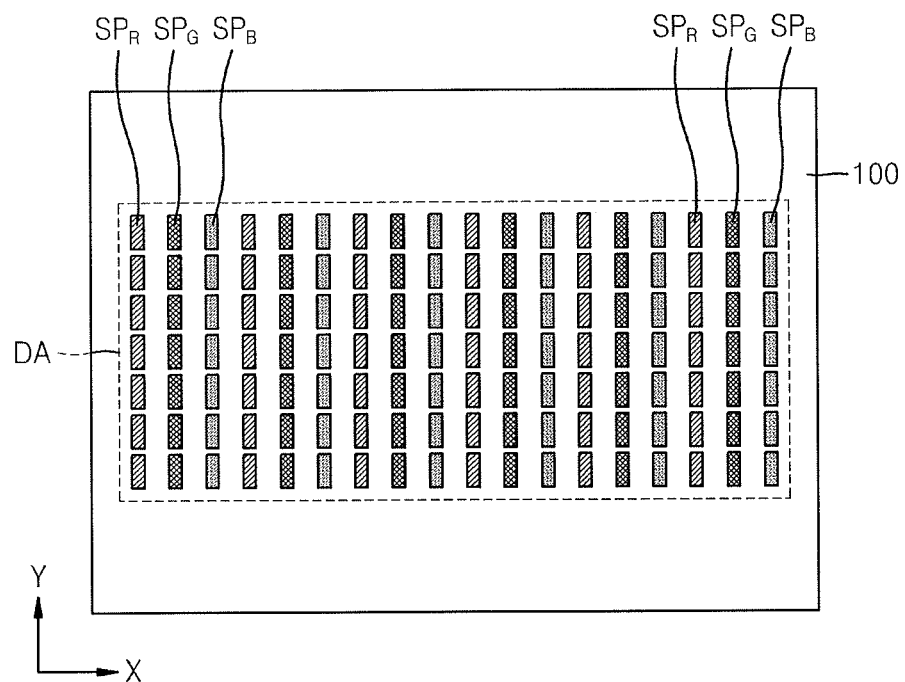

FIG. 3 illustrates a conceptual plan view illustrating a status in which the intermediate layers 230R, 230G, and 230B are formed. As illustrated in FIG. 3, sub-pixels, which emit light in the same wave-band in a first direction, i.e., along a Y-axis direction, are arranged. Additionally, sub-pixels, which emit light in different wave-bands in a second direction which crosses with the first direction, i.e., along an X-axis direction, are alternately arranged. In FIG. 3, a sub-pixel $SP_R$ which emits red light, a sub-pixel $SP_G$ which emits green light, and a sub-pixel $SP_B$ which emits blue light are alternately arranged in the second direction. Such sub-pixels may be placed in a display area DA of the substrate 100.

Figure 4:
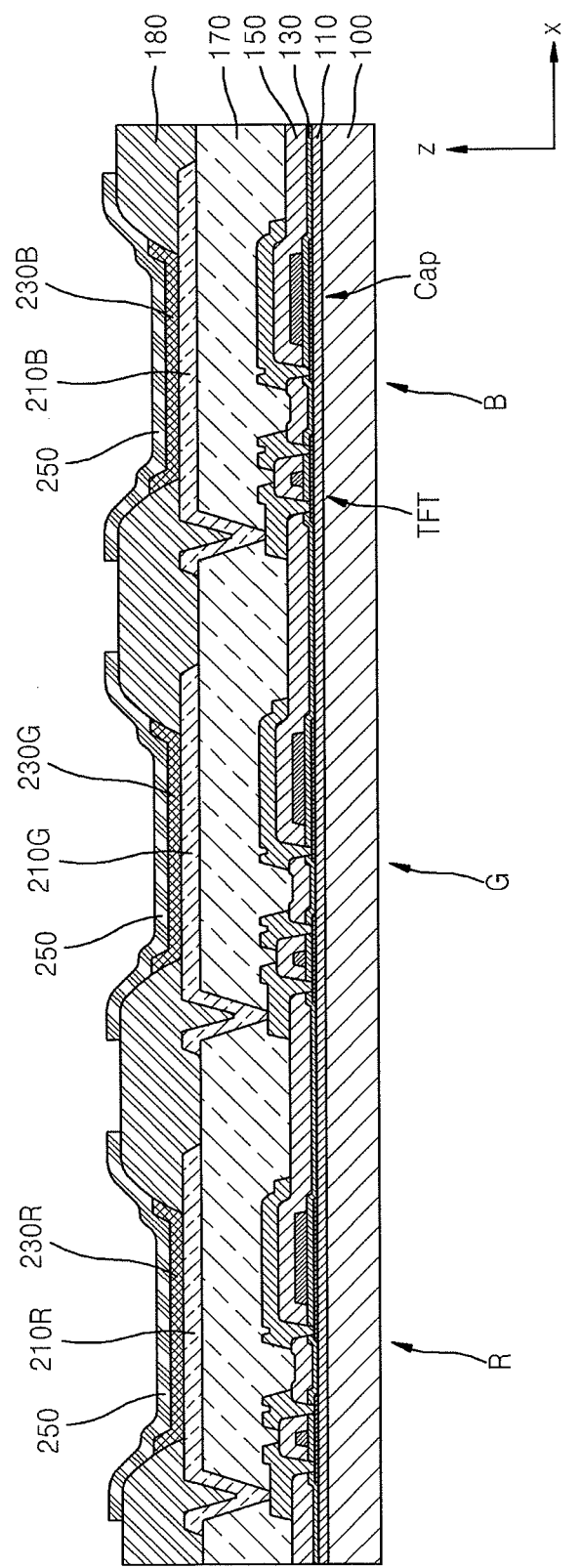
FIG. 4 illustrates a plan view of an arrangement of intermediate layers an organic light-emitting display apparatus according to an embodiment.

Once the intermediate layers 230R, 230G, and 230B are formed, a plurality of second electrodes 250, i.e., opposite electrodes 250, may be formed on the intermediate layers 230R, 230G, and 230B, as illustrated in FIG. 4, via a mask 300. The mask 300 and the formation of the second electrodes 250 via the mask 300 will be discussed in detail below with reference to FIGS. 5 and 6-8, respectively.

Figure 5:
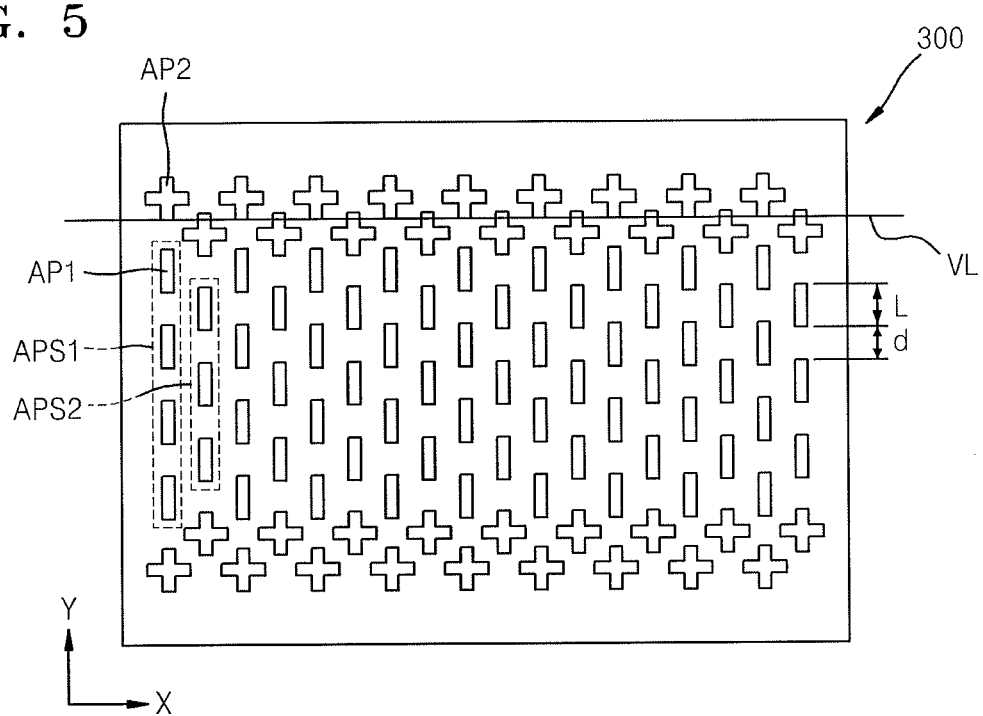
FIG. 5 illustrates a schematic plan view of a mask used in a method of manufacturing an organic light-emitting display apparatus according to an embodiment.

FIG. 5 illustrates a schematic plan view of the mask 300 that may be used in a method of manufacturing an organic light-emitting display apparatus according to embodiments.

The mask 300 according to the current embodiment may include an opening set APS1 that includes a plurality of first openings AP1 that extend in the first direction, i.e., along the Y-axis direction, and are separate from each other in the first direction. A plurality of opening sets may be placed in the second direction which crosses the first direction, i.e., along the X-axis direction. For example, as illustrated in FIG. 5, a number of the openings sets may vary, e.g., the opening set APS1 and an opening set APS2 may be arranged to be adjacent to each other in the second direction, and a number of the first openings AP1 included in each opening set may vary. For example, the opening set APS1 and the opening set APS2, which are arranged in the second direction, may be repeatedly arranged in the second direction. For example, the opening set APS1 may be offset along the first direction relative to the opening set APS2 among the alternating opening sets APS1 and APS2, so the plurality of the first openings AP1 within the alternating openings sets APS1 and APS2 may be arranged in a zigzag pattern in the second direction.

A length L of each of the plurality of the first openings AP1, which extends in the first direction, may be longer than a distance d between adjacent first openings AP1 in the first direction, i.e., along the Y-axis direction. As will be described later, this is so that, if the mask 300 is moved in the first direction and deposited multiple times, portions that are deposited only by depositing two times may be connected to each other in the first direction.

Additionally, the mask 300 in the current embodiment may include a plurality of "+" shaped second openings AP2, which are separated from each other in the second direction, i.e., along the X-axis direction, on a periphery of the mask 300. The plurality of the second openings AP2, which are separated from each other, may be located in a zigzag pattern in the second direction. In detail, the plurality of the second openings AP2, which are separated from each other, may be arranged in a zigzag pattern in the second direction, so that a virtual line VL extending in the second direction may pass through all of the plurality of the second openings AP2. As will be described later, this is so that, if the mask 300 is moved in the first direction, i.e., along the Y-axis direction, and deposited multiple times, portions that are deposited only by depositing two times may be connected to each other in the first direction.

Figure 6:
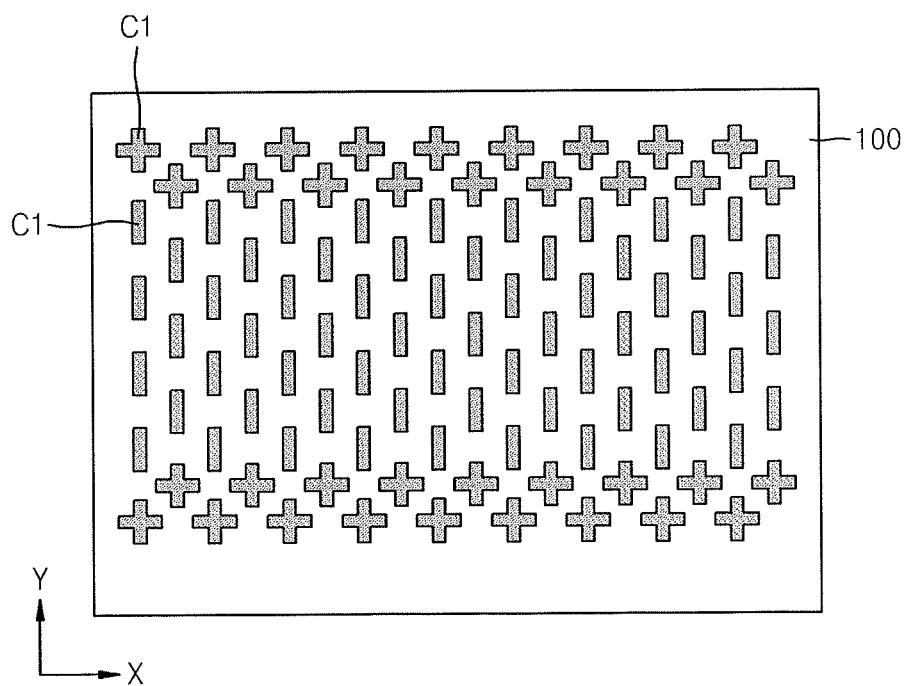
FIGS. 6-8 illustrate stages in a method of depositing a metal layer in an organic light-emitting display apparatus according to an embodiment via the mask of FIG. 5.
Figure 7:
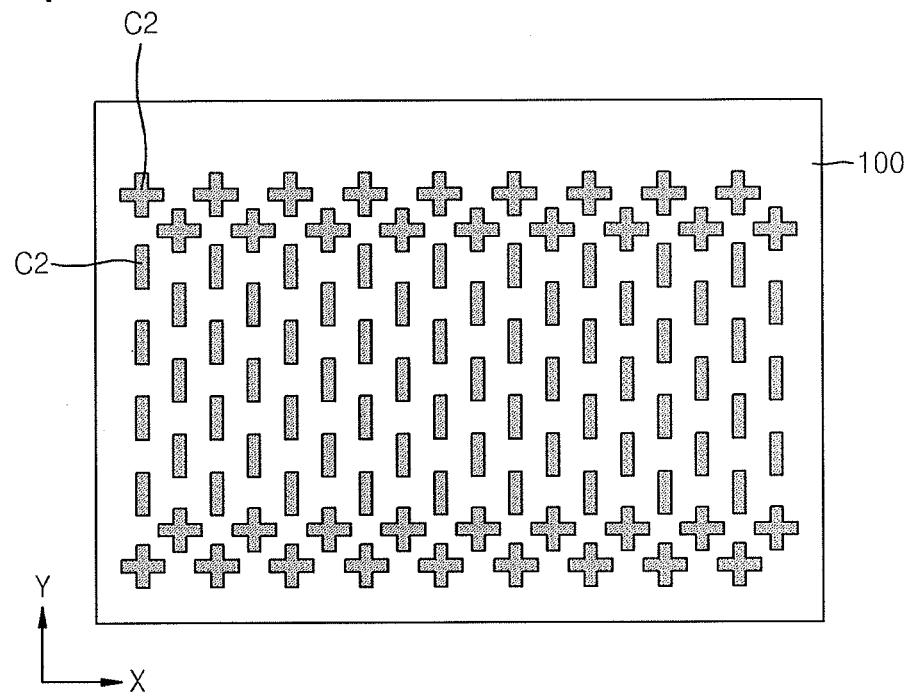

FIGS. 6-7 illustrate schematic plan views of a metal layer formed by using the mask 300.

As illustrated in FIG. 6, when a metal layer is deposited on the substrate 100 once by using the mask 300 that is shown in FIG. 5, a first conductive layer C1 that corresponds to the plurality of the first openings AP1 in the mask 300 is formed. The first conductive layer C1 is formed in the display area of the substrate 100. The first conductive layer C1 may also be formed in the peripheral area outside the display area of the substrate 100. Additionally, since the mask 300 also includes the plurality of the second openings AP2, in addition to the plurality of the first openings AP1, a part of the first conductive layer C1 may also correspond to the plurality of the second openings AP2 of the mask 300.

When a metal layer is deposited on the substrate 100 by using the mask 300 that is shown in FIG. 5, and if the metal layer is deposited by moving a location of the mask 300 along the first direction, i.e., along the Y-axis direction, a second conductive layer C2 is formed on the substrate 100. The second conductive layer C2 has the same pattern as the first conductive layer C1, but is placed in a different location from the first conductive layer C1, as illustrated in FIG. 7.

Figure 8:
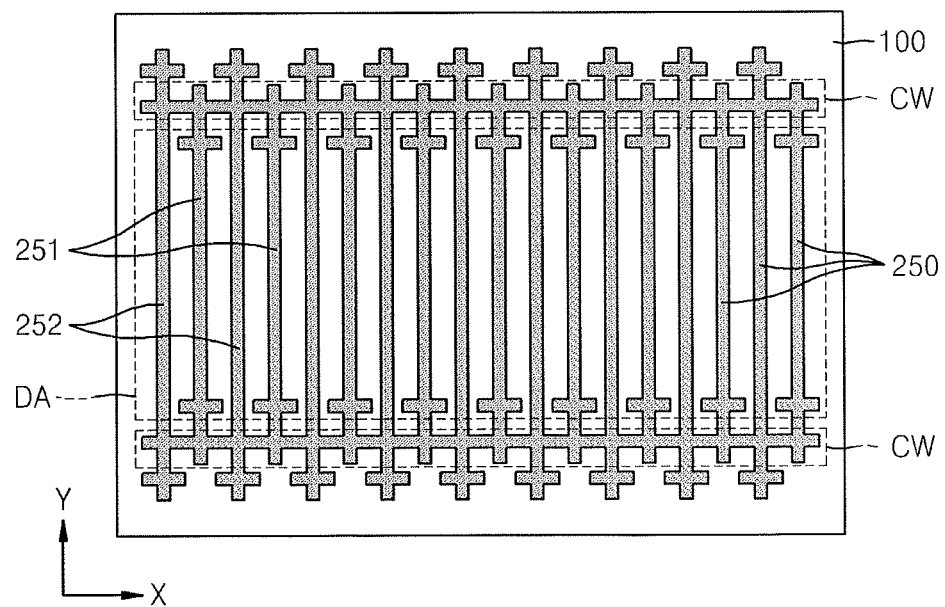

In detail, after the first conductive layer C1 is formed on the substrate 100, the same mask 300 is moved, e.g., shifted, along the Y-axis direction relative to the position of the formed first conductive layer C1. Next, the second conductive layer C2 is formed using the same mask 300 at the new, i.e., shifted, position. Thus, the first openings AP1 and the second openings AP2 in the mask 300 used to form the second conductive layer C2 are misaligned with the corresponding portions of the first conductive layer C1. Therefore, the second layer C2 is formed to, e.g., only, partially overlap with the first conductive layer C1. Thus, as illustrated in FIG. 8, a plurality of stripe-shaped second electrodes 250, which extend in the first direction (Y-axis direction) and are arranged in the second direction (X-axis direction) may be formed. The plurality of second electrodes 250 may be formed both in the peripheral area that surrounds the display area DA of the substrate 100 and in the display area DA. The plurality of the second electrodes 250 may be also referred to as a plurality of opposite electrodes.

Accordingly, as illustrated in FIG. 2, if the first conductive layer C1 and the second conductive layer C2 are formed by using the mask 300 on the intermediate layer 230R, 230G, and 230B, which is formed on the pixel electrodes 210R, 210G, and 210B, the plurality of the opposite electrodes 250 that respectively correspond to a red sub-pixel R, a green sub-pixel G, and a blue sub-pixel B are formed on the intermediate layer 230R, 230G, and 230B. The plurality of the opposite electrodes 250 are separate from each other, and extend in the first direction, i.e., in the Y-axis direction, as illustrated in FIG. 8.

Additionally, as illustrated in FIG. 8, since the mask 300 includes the plurality of the second openings AP2, i.e., the "+" shaped second openings AP2, which are separate from each other along the second direction on the periphery of the mask 300, a connection wiring CW in the second direction, i.e., in the X-axis direction, may be formed, by forming the first conductive layer C1 and the second conductive layer C2. The connection wiring CW may have a plurality of "+" shape portions that are arranged to, e.g., partially, contact, e.g., overlap with, each other in the second direction. The connection wiring CW may electrically connect the plurality of the second electrodes 250 with each other.

Additionally, since the mask 300 includes the plurality of the second openings AP2 on a first periphery of the mask 300 and a second periphery of the mask 300 that face each other in the first direction, i.e., in the Y-axis direction, the connection wiring CW may be respectively formed on the first periphery and the second periphery of the substrate 100. For example, two connection wiring CW may be formed along two opposite edges of the substrate 100, so the two connection wiring CW may be separate from each other along the Y-axis direction.

According to a conventional method of manufacturing an organic light-emitting display apparatus, an opposite electrode is formed as one, e.g., a single, body corresponding to, e.g., overlapping, a plurality of pixel electrodes. Accordingly, a voltage drop is generated at the opposite electrode which is formed as one body. Thus, the quality of a displayed image may deteriorate. That is, when a single opposite electrode having a resistance other than zero is formed to correspond to a plurality of pixels or sub-pixels, the voltage may vary according to the relative locations, e.g., positions, inside the single opposite electrode. Thus, even if the same electrical signal is applied to the pixel electrodes of a plurality of pixels or sub-pixels, the amount of emitted light may vary, i.e., in accordance with the varying voltage.

However, according to a method of manufacturing an organic light-emitting display apparatus in accordance with the exemplary embodiments, a plurality of the opposite electrodes 250, which are patterned in a stripe shape, may be easily formed by using one mask 300. Accordingly, deterioration of image quality, which may be caused by a voltage drop in the second direction, i.e., in the X-axis direction, may be effectively prevented.

Additionally, the connection wiring CW is respectively formed on the first periphery and the second periphery of the substrate 100. Here, the first periphery and the second periphery face each other in the first direction. Thus, when an electrical signal is applied to the plurality of opposite electrodes 250, the same electrical signal is applied to both ends of each of the plurality of the opposite electrodes 250. Therefore, a voltage drop may be minimized in the first direction, i.e., in the Y-axis direction, of each of the plurality of the opposite electrodes 250.

Additionally, in the case of manufacturing the organic light-emitting display apparatus in the current embodiment, a conductive layer is deposited two times by using the mask 300 that is shown in FIG. 5. Thus, a plurality of the stripe-shaped second electrodes 250 may be formed. Therefore, the first openings AP1 or the second openings AP2 are openings that extends in one direction for a short distance or are "+" shape openings, rather than openings that extend from one end to the other end of the mask 300 for a long distance. Accordingly, when a conductive layer is deposited by using the mask 300, deformation of the relatively shorter openings of the mask 300 may be minimized. Therefore, a defect rate in manufacturing an organic light-emitting display apparatus may be substantially reduced, thereby improving the manufacturing yield.

The plurality of the second electrodes 250 and the connection wiring CW may be formed as a transparent or translucent electrode layer or a reflective electrode layer. If formed as a transparent or translucent electrode layer, the plurality of the second electrodes 250 and the connection wiring CW may be formed to have a multilayered structure that includes a first deposition layer, which is formed of, e.g., lithium (Li), calcium (Ca), lithium-fluoride-calcium (LiF/Ca), lithium-fluoride-aluminum (LiF/Al), aluminum (Al), magnesium (Mg), or a compound thereof, and a second deposition layer, which is formed of a translucent or transparent material, e.g., ITO (indium tin oxide), IZO (indium zinc oxide), zinc oxide (ZnO), or indium oxide ($In_2O_3$). If formed as a reflective electrode layer, the plurality of the second electrodes 250 and the connection wiring CW may be formed to have a layer that includes at least one of Li, Ca, LiF/Ca, LiF/Al, Al, Ag, and/or Mg.

Figure 9:
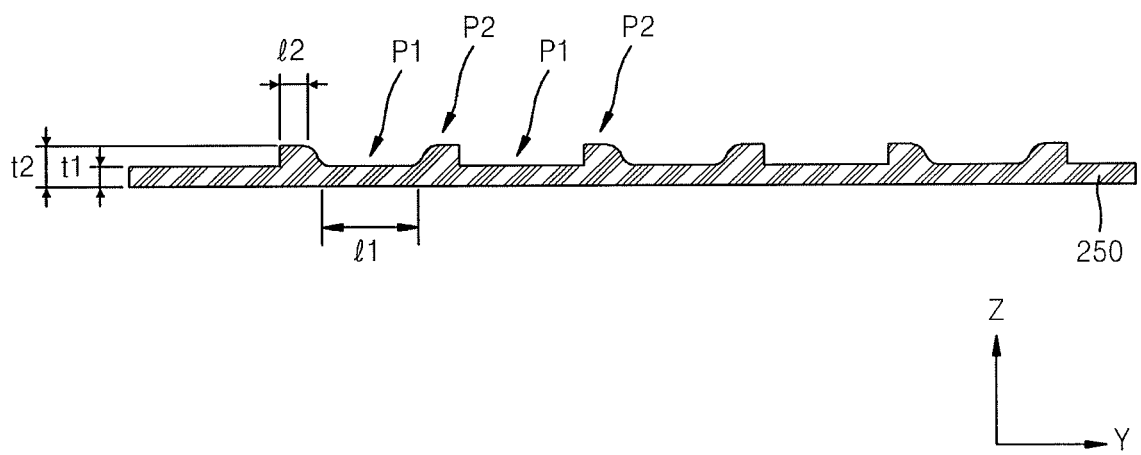
FIG. 9 illustrates a schematic cross-sectional view of a part of the metal layer in FIG. 8.

With regard to the plurality of the opposite electrodes 250 included in an organic light-emitting display apparatus, which is manufactured by using such a manufacturing method, a shape of a portion that extends in the first direction, i.e., in the Y-axis direction, may be as illustrated in FIG. 9. That is, the plurality of the opposite electrodes 250 is formed when the first conductive layer C1 and the second conductive layer C2, e.g., only, partially overlap each other in the first direction. Accordingly, each of the plurality of the opposite electrodes 250 may have a non-uniform thickness along the first direction, while the thickness is being measured along a third direction, e.g., each of the plurality of the opposite electrodes 250 may periodically have a portion whose thickness is greater in the display area when measured in the third direction.

In detail, each of the plurality of the second electrodes 250 may alternately include a first part P1 having a length Q1 in the first direction, i.e., in the Y-axis direction, and a thickness t1 in the third direction, i.e., in the Z-axis direction, and a second part P2 having a length l2 in the first direction, i.e., in the Y-axis direction, and a thickness t2 which is greater than t1. The second part P2, i.e., a portion including an overlap of the first conductive layer C1 and the second conductive layer C2, has a shorter length l2 than the length l1 of the first part P1. That is, l1 is longer than l2. Additionally, unlike the first part P1, i.e., a portion including only one of the first conductive layer C1 and the second conductive layer C2, the second part P2 is a part in which a conductive material is deposited twice, i.e., both the first and second conductive layers C1 and C2. Thus, the thickness t2, i.e., the thickness of the second part P2, may equal about twice the thickness t1, i.e., the thickness of the first part P1.

Similarly, the connection wiring CW, which extends in the second direction, i.e., the X-axis direction, may also periodically have a portion with a greater thickness. In detail, the connection wiring CW may alternately include a third part having a length in the second direction and a thickness in the third direction, i.e., along the Z-axis direction, and a fourth part having a length in the second direction and a thickness which is greater than the thickness of the third part. The fourth part, which is formed where the first conductive layer C1 and the second conductive layer C2 overlap each other, has a shorter length than the third part. Additionally, unlike the third part in which a conductive material is deposited once, the fourth part, which is formed where the first conductive layer C1 and the second conductive layer C2 overlap each other, is a part in which a conductive material is deposited twice. Thus, the thickness of the fourth part may be about twice the thickness of the third part.

Additionally, the mask 300 includes a plurality of the "+" shaped second openings AP2, which are separate from each other along the second direction, i.e., along the X-axis direction, on the periphery of the mask 300. Thus, the connection wiring CW that is extended in the second direction, i.e., in the X-axis direction, may be formed where the first conductive layer C1 and the second conductive layer C2 are formed as illustrated in FIG. 8. The connection wiring CW may have a plurality of "+" shape portions that are arranged to partially overlap each other along the second direction. The connection wiring CW may electrically connect the plurality of the second electrodes 250 with each other. Additionally, the mask 300 includes the plurality of the second openings AP2 on the first periphery of the mask 300 and the second periphery of the mask 300. Here, the first periphery and the second periphery face each other in the first direction, i.e., in the Y-axis direction. Thus, the connection wiring CW may be respectively formed on the first periphery and the second periphery of the substrate 100.

Referring back to FIG. 8, the plurality of the second electrodes 250 may have a shape that extends from the peripheral area toward the display area DA. The second electrodes 250 may include, e.g., alternating, parts 251 and remaining parts 252 that extend in the first direction and cross the connection wiring CW. Thus, parts 251 of the plurality of the second electrodes 250, but not the connection wiring CW, may have a "+" shape portion. For example, the parts 251 among the plurality of the second electrodes 250 may have a "+" shape portion at the connection wiring CW and adjacent to the display area DA. The remaining parts 252, i.e., other than the parts 251, among the plurality of the second electrodes 250, extend in the first direction to cross the connection wiring CW. The remaining parts 252 may have a "+" shape portion at the connection wiring CW and a region spaced a part from, i.e., in a direction opposite to, the display area DA, i.e., a direction of the periphery of the substrate 100. This is because, with regard to the plurality of the second openings AP2 that are separate from each other as illustrated in FIG. 5, the first conductive layer C1 is formed by using the mask 300 which is placed in a zigzag pattern, the mask 300 is moved in the first direction, and then, the second conductive layer C2 is formed.

Above, the plurality of the second electrodes 250 illustrated in FIG. 8 was described as formed by forming the first and second conductive layers C1 and C2 via the mask 300. However, the embodiments are not limited thereto, e.g., the plurality of the second electrodes 250 may be formed by using a different method.

Figure 10:
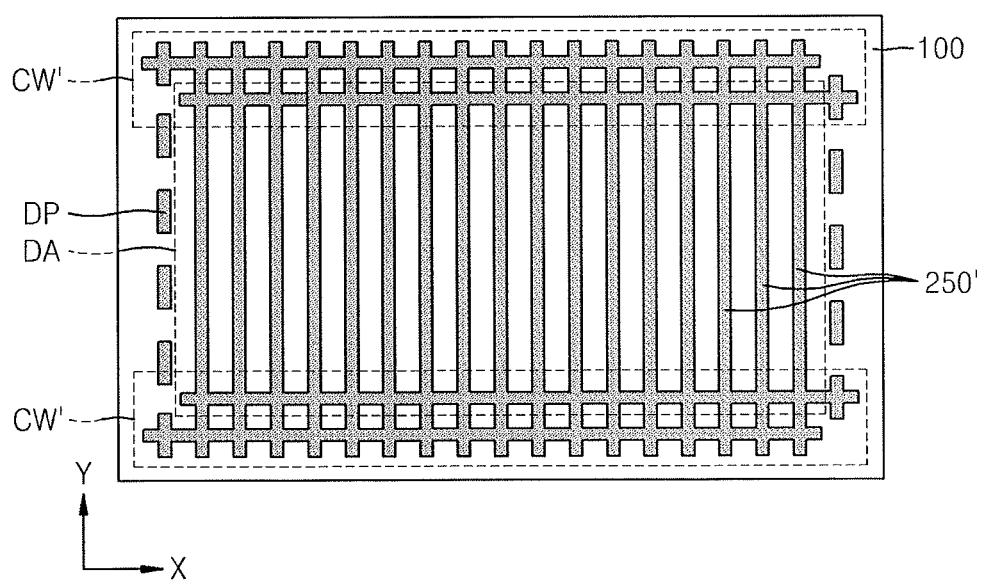
FIG. 10 illustrates a schematic plan view of a part of an organic light-emitting display apparatus according to another embodiment.

For example, the first conductive layer C1 may be formed, followed by moving the mask 300 in the second direction, instead of the first direction. Then, the second conductive layer may be formed. Thus, a plurality of second electrodes 250' may be formed as illustrated in FIG. 10. In this case, as illustrated in FIG. 10, an island-shaped dummy pattern DP, which includes the same material as the plurality of the second electrodes 250', may be formed outside the display area DA.

In this case, a connection wiring CW' may be also respectively formed on the first periphery of the substrate 100 and the second periphery of the substrate 100. Here, the first periphery and the second periphery face each other in the first direction of the substrate 100. Unlike the connection wiring CW shown in FIG. 8, the connection wiring CW', which is formed on the first periphery of the substrate 100, may have a shape that doubly extends in the second direction, i.e., in the X-axis direction. Additionally, the connection wiring CW' is not necessarily placed only in the peripheral area that surrounds the display area DA, e.g., the connection wiring CW' may be placed across the peripheral area and the display area DA, as illustrated in FIG. 10, or the connection wiring CW' may be placed in an area of the display area which is adjacent to the peripheral area.

Above, a description of a method of manufacturing an organic light-emitting display apparatus, and the mask which is used for the method has been mainly provided. However, embodiments are not limited thereto.

The organic light-emitting display apparatus of the current embodiment may have a configuration as illustrated in FIG. 4. That is, the organic light-emitting display apparatus of the current embodiment may include the plurality of the first electrodes 210R, 210G, and 210B that are disposed in the display area of the substrate 100, the plurality of the stripe-shaped second electrodes 250 that extend in the first direction, i.e., in the Y-axis direction, and are arranged in the second direction which crosses the first direction, i.e., in the X-axis direction, the intermediate layer 230R, 230G, and 230B that are interposed between the plurality of the first electrodes 210R, 210G, and 210B and the second electrodes 250 and include a light-emitting layer, and the connection wiring CW that is located in the peripheral area that surrounds the display area DA. The connection wiring CW may be located in an area which is adjacent to the peripheral area of the display area, or located in a peripheral area of the display area and electrically connects a plurality of the second electrodes 250 with each other. A shape of the plurality of the second electrodes 250 and the connection wiring CW may be the same as that illustrated in FIG. 8.

Each of a plurality of the second electrodes 250 may have an uneven thickness in the display area DA along the first direction, as illustrated in FIG. 9. In detail, each of the plurality of the second electrodes 250 may alternately include the first part P1 having a length in the first direction, i.e., in the Y-axis direction, and a thickness t1, and the second part P2 having a length in the first direction, i.e., in the Y-axis direction, and a thickness t2 which is greater than t1, along the first direction. The second part P2, which is formed where the first conductive layer C1 and the second conductive layer C2 overlap each other, has a shorter length than the first part P1. That is, l1 becomes longer than l2. Additionally, unlike the first part P1 in which a conductive material is deposited once, the second part P2, which is formed where the first conductive layer C1 and the second conductive layer C2 overlap each other, is a part in which a conductive material is deposited twice. Thus, t2, which is a thickness of the second part P2, may be about twice t1, which is a thickness of the first part P1.

Similarly, the connection wiring CW, which extends in the second direction, i.e., the X-axis direction, may also periodically have a portion with a greater thickness. In detail, the connection wiring CW may alternately include a third part having a length in the second direction and a thickness in the third direction, i.e., along the Z-axis direction, and a fourth part having a length in the second direction and a thickness which is greater than the thickness of the third part. The fourth part, which is formed where the first conductive layer C1 and the second conductive layer C2 overlap each other, has a shorter length than the third part. Additionally, unlike the third part in which a conductive material is deposited once, the fourth part, which is formed where the first conductive layer C1 and the second conductive layer C2 overlap each other, is a part in which a conductive material is deposited twice. Thus, the thickness of the fourth part may be about twice the thickness of the third part.

Additionally, the mask 300 includes a plurality of the "+" shaped second openings AP2, which are separate from each other along the second direction, that is, the X-axis direction, on a periphery of the mask 300. Thus, the connection wiring CW which is extended in the second direction, that is, the X-axis direction, may be formed as the first conductive layer C1 and the second conductive layer C2 are formed as illustrated in FIG. 8. The connection wiring CW may have a plurality of "+" shape portions that are disposed to partially overlap each other in the second direction. The connection wiring CW may electrically connect a plurality of the second electrodes 250 with each other. Additionally, the mask 300 includes a plurality of the second openings AP2 on the first periphery of the mask 300 and the second periphery of the mask 300. Here, the first periphery and the second periphery face each other in the first direction, i.e., the Y-axis direction. Thus, the connection wiring CW may be respectively formed on the first periphery and the second periphery of the substrate 100.

The plurality of the second electrodes 250 may have a shape that extends from the peripheral area to inside the display area DA. Thus, parts 251 of the plurality of the second electrodes 250, but not the connection wiring CW, may have a "+" shape portion. In detail, the parts 251 among the plurality of the second electrodes 250 may have a "+" shape portion in a direction of the display area DA. Remaining parts 252 other than the parts 251, among the plurality of the second electrodes 250, extend in the first direction, i.e., the Y-axis direction, so as to cross the connection wiring CW. The remaining parts 252 may have a "+" shape portion from the connection wiring CW toward a direction opposite to the display area DA, i.e., a direction of a periphery of the substrate 100. This is because, as illustrated in FIG. 5, the first conductive layer C1 is formed by using the mask 300 in which the plurality of the second openings AP2, which are separate from each other, are placed, the mask 300 is moved in the first direction, i.e., in the Y-axis direction, and then, the second conductive layer C2 is formed.

However, in a case of the organic light-emitting display apparatus in the current embodiment, a plurality of the opposite electrodes 250, which are patterned in a striped shape, may be easily formed by using one mask 300. Accordingly, deterioration of image quality, which may be caused by a voltage drop in the second direction, may be effectively prevented. Additionally, the connection wiring CW is respectively formed on the first periphery and the second periphery of the substrate 100 in the first direction. Thus, when an electrical signal is applied to the plurality of the opposite electrodes 250, the same electrical signal is applied to both ends of each of the plurality of the opposite electrodes 250. Therefore, a voltage drop may be minimized in the first direction of each of the plurality of the opposite electrodes 250.

In a case of an organic light-emitting display apparatus according to another embodiment, an island-shaped dummy pattern DP, which includes the same material as the plurality of the second electrodes 250, may be formed outside the display area DA, as illustrated in FIG. 10.

According to an embodiment, an organic light-emitting display apparatus for preventing deterioration of image quality of a display that may be caused by a voltage drop, a method of manufacturing the organic light-emitting display apparatus, and a mask that is used for the manufacturing may be implemented. However, embodiments are not limited to the preventing of the image quality deterioration.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
   a substrate including a display area and a peripheral area surrounding the display area, a plurality of pixels being disposed in the display area;
   a plurality of first electrodes in the display area;
   a plurality of stripe-shaped second electrodes in the display area, the second electrodes extending in a first direction and being spaced apart from each other in a second direction crossing the first direction, and each of the plurality of the second electrodes having an uneven thickness along the first direction inside the display area;
   an intermediate layer between corresponding first and second electrodes, the intermediate layer having a light-emitting layer; and
   a connection wiring electrically connecting the plurality of the second electrodes with each other, the connection wiring being disposed in the peripheral area, in an area of the display area which is adjacent to the peripheral area, or across the display area and the peripheral area, the connection wiring not overlapping with the plurality of pixels.

2. An organic light-emitting display apparatus, comprising:
   a substrate including a display area and a peripheral area surrounding the display area, a plurality of pixels being disposed in the display area;
   a plurality of first electrodes in the display area;
   a plurality of stripe-shaped second electrodes in the display area, the second electrodes extending in a first direction and being spaced apart from each other in a second direction crossing the first direction, and each of the plurality of the second electrodes having an uneven thickness along the first direction inside the display area;

an intermediate layer between corresponding first and second electrodes, the intermediate layer having a light-emitting layer; and a connection wiring electrically connecting the plurality of the second electrodes with each other, the connection wiring being disposed in the peripheral area, in an area of the display area which is adjacent to the peripheral area, or across the display area and the peripheral area, wherein each second electrode of the plurality of stripe-shaped second electrodes continuously extends in the first direction to overlap a plurality of pixels, and wherein each of the plurality of the second electrodes includes first and second portions adjacent to each other in the first direction and extending in the first direction in the display area, a thickness of the first portions in a third direction being smaller than a thickness of the second portions.

3. The organic light-emitting display apparatus as claimed in claim 2, wherein each of the plurality of the second electrodes includes alternating first and second portions, the first portion including a length l1 in the first direction and a thickness t1, and the second portion including a length l2 in the first direction and a thickness t2 greater than the thickness t1.

4. The organic light-emitting display apparatus as claimed in claim 3, wherein the length l1 is longer than the length l2.

5. The organic light-emitting display apparatus as claimed in claim 3, wherein the thickness t2 is twice the thickness t1.

6. The organic light-emitting display apparatus as claimed in claim 1, wherein the plurality of the second electrodes extends from the peripheral area into the display area.

7. An organic light-emitting display apparatus, comprising:

a substrate including a display area and a peripheral area surrounding the display area, a plurality of pixels being disposed in the display area;

a plurality of first electrodes in the display area;

a plurality of stripe-shaped second electrodes in the display area, the second electrodes extending in a first direction and being spaced apart from each other in a second direction crossing the first direction, and each of the plurality of the second electrodes having an uneven thickness along the first direction inside the display area;

an intermediate layer between corresponding first and second electrodes, the intermediate layer having a light-emitting layer; and a connection wiring electrically connecting the plurality of the second electrodes with each other, the connection wiring being disposed in the peripheral area, in an area of the display area which is adjacent to the peripheral area, or across the display area and the peripheral area, wherein the connection wiring extends in the second direction, the connection wiring having a non-uniform thickness in the second direction.

8. The organic light-emitting display apparatus as claimed in claim 7, wherein the connection wiring alternately includes a third part having a length l3 in the second direction and a thickness t3 in the third direction, and a fourth part having a length l4 in the second direction and a thickness t4 greater than the thickness t3 in the third direction.

9. The organic light-emitting display apparatus as claimed in claim 8, wherein the length l3 is longer than the length l4.

10. The organic light-emitting display apparatus as claimed in claim 8, wherein the thickness t4 is about twice the thickness t3.

11. The organic light-emitting display apparatus as claimed in claim 7, wherein the connection wiring includes a plurality of "+" shape portions that partially overlap each other along the second direction.

12. The organic light-emitting display apparatus as claimed in claim 11, wherein the plurality of the second electrodes extends from the peripheral area into the display area, first parts of the plurality of the second electrodes include the "+" shape portions.

13. The organic light-emitting display apparatus as claimed in claim 12, wherein the first parts include the "+" shape portions of the plurality of the second electrodes between the connection wiring and the display area.

14. The organic light-emitting display apparatus as claimed in claim 13, wherein the plurality of the second electrodes further comprises second parts extending in the first direction and including the "+" shape portions, the connection wiring being between the display area and the "+" shape portions of the second parts.

15. The organic light-emitting display apparatus as claimed in claim 1, further comprising a dummy pattern including a same material as the second electrodes outside the display area.

16. A method of manufacturing an organic light-emitting display apparatus, the method comprising:

preparing a substrate including a display area, in which a plurality of pixels are to be disposed, and a peripheral area surrounding the display area;

forming a plurality of first electrodes in the display area of the substrate;

forming an intermediate layer on the plurality of the first electrodes, the intermediate layer including a light-emitting layer;

forming a plurality of stripe-shaped second electrodes in the display area and a connection wiring, the second electrodes extending in a first direction and being spaced apart from each other in a second direction crossing the first direction, each of the plurality of the second electrodes having an uneven thickness along the first direction inside the display area, and the connection wiring electrically connecting the plurality of the second electrodes with each other, wherein the connection wiring is disposed in the peripheral area, in an area of the display area which is adjacent to the peripheral area, or across the display area and the peripheral area, the connection wiring not overlapping with the plurality of pixels.

17. The method as claimed in claim 16, wherein forming the plurality of the second electrodes includes:

depositing a first conductive layer through a mask with a plurality of opening sets, such that the first conductive layer corresponds to first openings of the mask in the display area of the substrate, each opening set of the mask extending in a first direction and being spaced apart from an adjacent opening set in the second direction, and each opening set including a plurality of the first openings separate from each other in the first direction;

moving the mask along the first direction or along the second direction; and depositing a second conductive layer that corresponds to the first openings of the mask in the display area of the substrate, such that the second conductive layer partially overlaps with the first conductive layer.

18. The method as claimed in claim 17, wherein a length of each of the plurality of the first openings in the first direction is greater than a distance between adjacent first openings in the first direction.

19. The method as claimed in claim 18, wherein forming the second conductive layer includes forming the second conductive layer to only partially overlap with the first conductive layer, such that the first conductive layer and the second conductive layer from a plurality of stripe-shaped second electrodes which extend in the first direction and are arranged in the second direction.

20. The method as claimed in claim 19, wherein:
the mask further comprises a plurality of "+" shaped second openings that are separate from each other in the second direction on a periphery of the mask, and
forming of the second conductive layer includes forming the connection wiring to have a plurality of "+" shape portions which are disposed to partially overlap with each other along the second direction.

* * * * *